(12) United States Patent
Uchida et al.

(10) Patent No.: US 10,989,780 B2
(45) Date of Patent: Apr. 27, 2021

(54) MAGNETIC RESONANCE IMAGING SYSTEM AND RECEIVING COIL UNIT

(71) Applicant: Canon Medical Systems Corporation, Otawara (JP)

(72) Inventors: Daisuke Uchida, Kawasaki (JP); Koji Akita, Yokohama (JP)

(73) Assignee: Canon Medical Systems Corporation, Otawara (JP)

( * ) Notice: Subject to any disclaimer, the term of this patent is extended or adjusted under 35 U.S.C. 154(b) by 175 days.

(21) Appl. No.: 16/035,931

(22) Filed: Jul. 16, 2018

(65) Prior Publication Data

US 2019/0025399 A1 Jan. 24, 2019

(30) Foreign Application Priority Data

Jul. 18, 2017 (JP) .............................. JP2017-139254

(51) Int. Cl.
*G01R 33/565* (2006.01)
*G01R 33/36* (2006.01)

(52) U.S. Cl.
CPC ... *G01R 33/56545* (2013.01); *G01R 33/3607* (2013.01); *G01R 33/3692* (2013.01); *G01R 33/3621* (2013.01)

(58) Field of Classification Search
CPC .......... G01R 33/56545; G01R 33/3607; G01R 33/3692; G01R 33/3621; G01R 33/36; H04L 7/0091; A61N 1/0558

USPC ........ 324/300, 307–322, 600, 713, 500–521, 324/522, 764.01, 718, 115–124, 76.11, 324/200, 207.13–245, 529–530
See application file for complete search history.

(56) References Cited

U.S. PATENT DOCUMENTS

2010/0117649 A1 5/2010 Nakanishi et al.
2011/0227574 A1* 9/2011 Akita ................. G01R 33/3692
324/322

FOREIGN PATENT DOCUMENTS

JP  5355044    11/2013
JP  5422453    2/2014

* cited by examiner

*Primary Examiner* — Melissa J Koval
*Assistant Examiner* — Trung Nguyen
(74) *Attorney, Agent, or Firm* — Oblon, McClelland, Maier & Neustadt, L.L.P.

(57) ABSTRACT

According to one embodiment, a magnetic resonance imaging system includes a magnetic resonance imaging apparatus and a receiving coil unit. The apparatus includes first circuitry which transmits an RF pulse based on a first clock. The coil unit includes clock generating circuitry, a receiving coil and first conversion circuitry. The clock generating circuitry generates a second clock. The first conversion circuitry samples a magnetic resonance signal in accordance with the second clock. The coil unit further includes generation circuitry which generates shift information regarding a difference between the first clock and the second clock, and shift correction circuitry which corrects the sampled magnetic resonance signal by using the shift information.

20 Claims, 16 Drawing Sheets

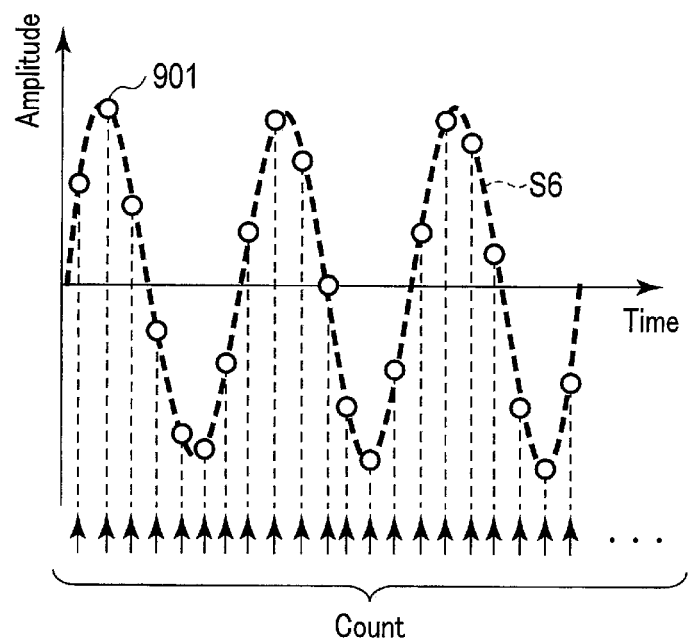
F I G. 9
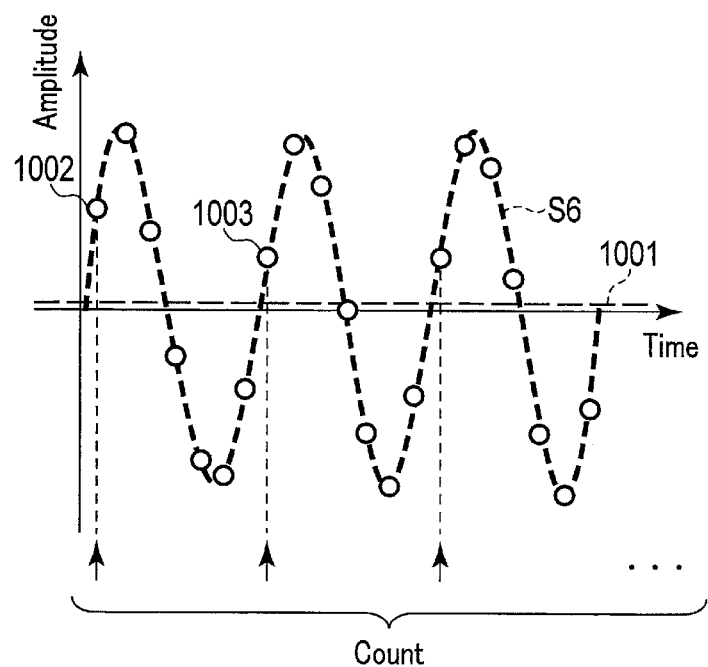
F I G. 10

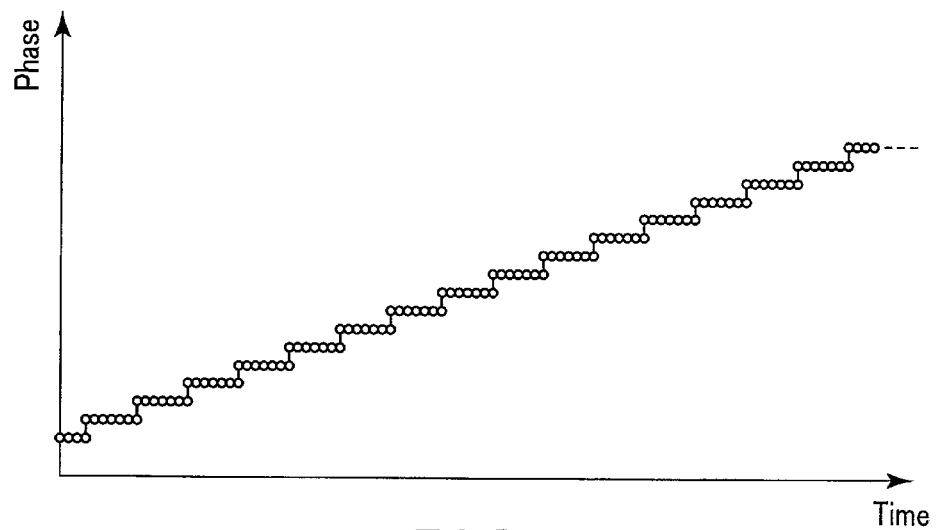
F I G. 14
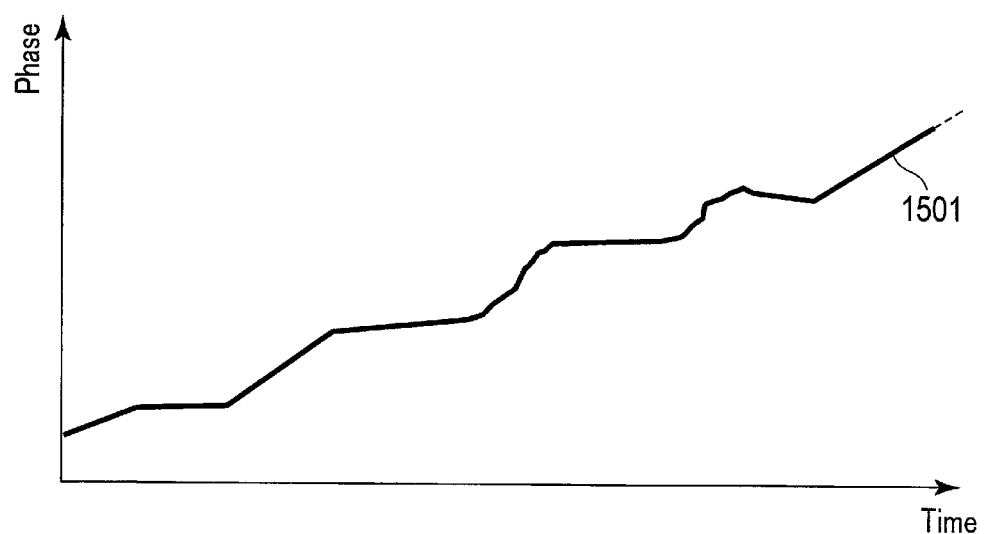
F I G. 15

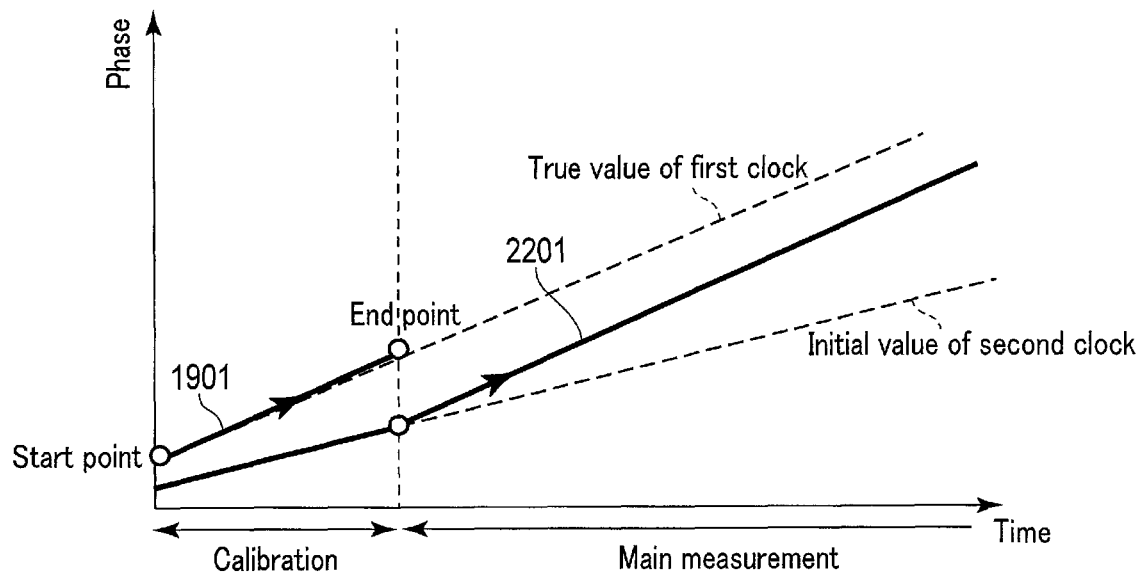
F I G. 22
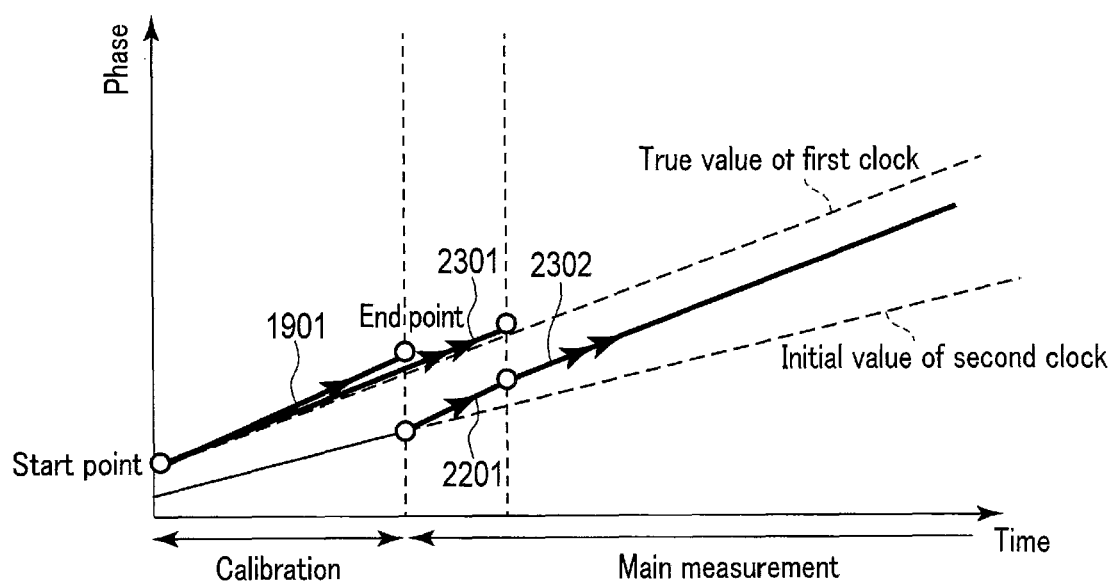
F I G. 23

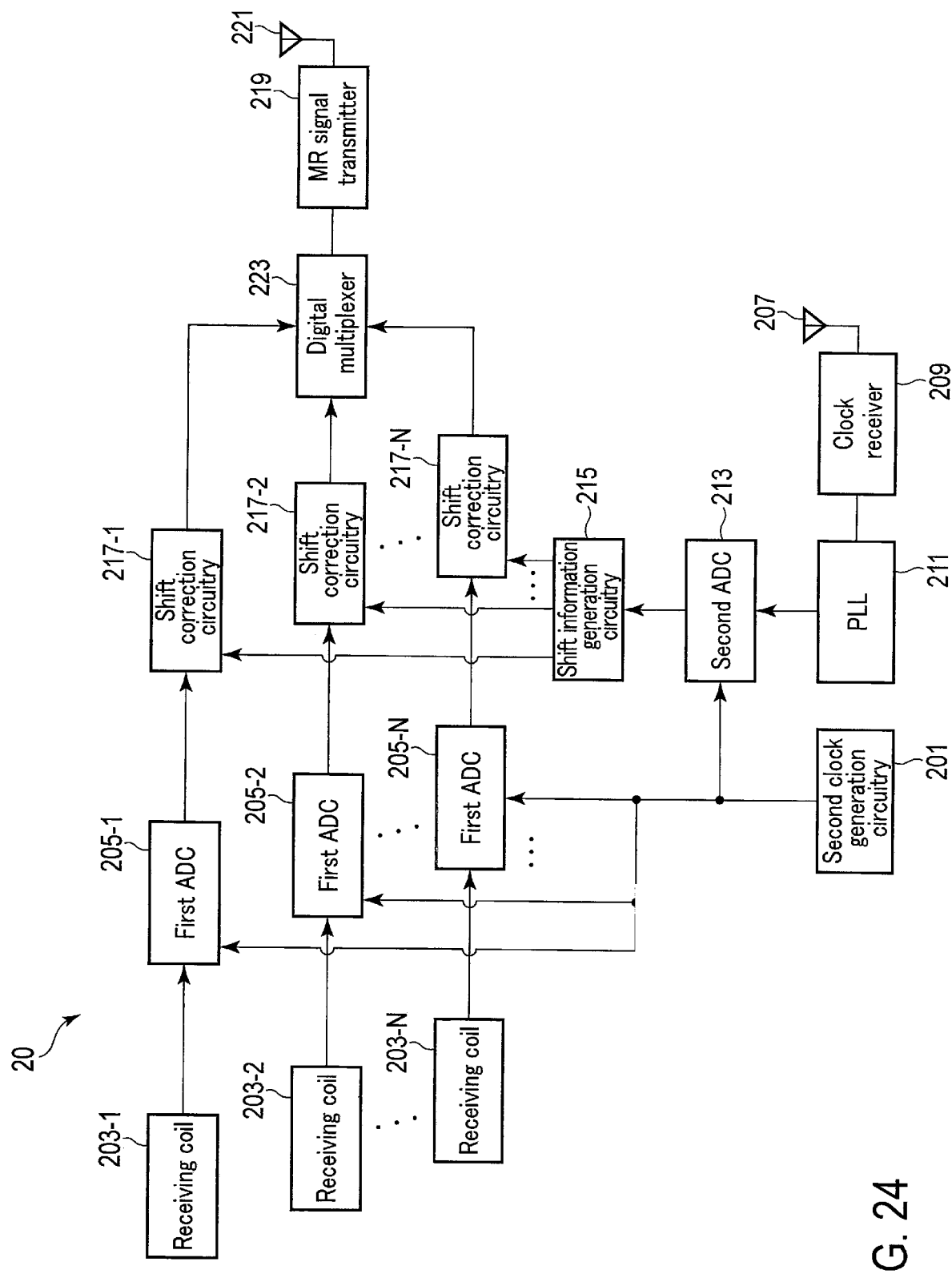
F I G. 24

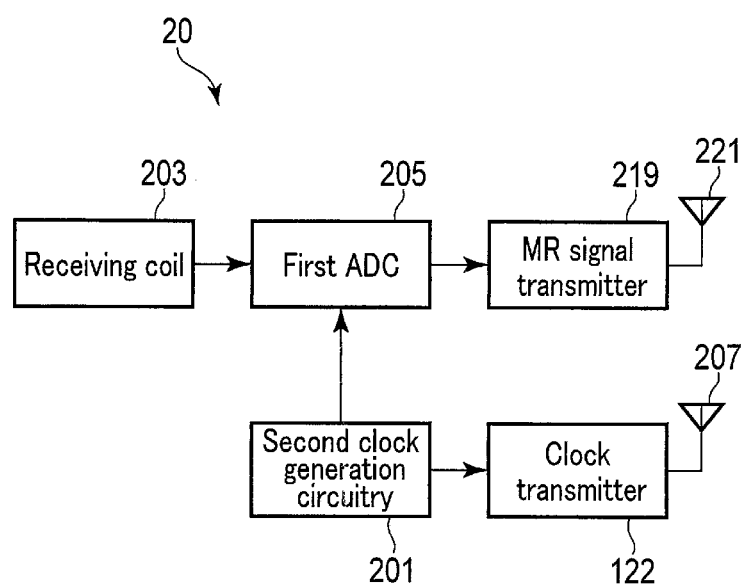
F I G. 26

MAGNETIC RESONANCE IMAGING SYSTEM AND RECEIVING COIL UNIT

CROSS-REFERENCE TO RELATED APPLICATIONS

This application is based upon and claims the benefit of priority from the prior Japanese Patent Application No. 2017-139254 filed Jul. 18, 2017, the entire contents of which are incorporated herein by reference.

FIELD

Embodiments described herein relate generally to a magnetic resonance imaging system and a receiving coil unit.

BACKGROUND

In magnetic resonance imaging apparatuses, magnetic resonance signals are often transmitted to a system from a coil attached to a subject by wiring. However, the setting up of cables becomes an operator's burden, and leads to a mental burden being placed on a patient. Accordingly, it has been proposed to replace wiring transmission with wireless transmission, thus enabling easy set-up by eliminating a need to set up cables.

In order to adopt wireless transmission, there is a need to prevent adverse effects on the accuracy of captured images. Thus, clock synchronization between a coil side and a system side is required to be accomplished.

One clock synchronization method involves transmitting a clock wirelessly and synchronizing the coil side and the system side. On the coil side, after receiving a clock, the received clock is input to an A/D converter through a multiplier. However, since a clock is transmitted through a wireless path, irregular fluctuations affect the clock. These irregular fluctuations cannot be ignored in magnetic resonance imaging apparatuses that require highly accurate synchronization, and may cause a phase shift in an echo signal.

BRIEF DESCRIPTION OF THE DRAWINGS

FIG. 9 illustrates an example of counting processing by shift information generation circuitry.

FIG. 10 illustrates the first example of a method of counting positive half cycles of a clock waveform.

FIG. 14 illustrates an example of phase characteristics of a digital third clock waveform.

FIG. 15 illustrates phase characteristics of sampling points from the observation start point of a third clock to the end point.

FIG. 22 illustrates the first adjustment example of a second clock signal.

FIG. 23 illustrates the second adjustment example of the second clock signal.

FIG. 24 is a block diagram of a receiving coil unit according to the second embodiment.

FIG. 26 is a block diagram of a receiving coil unit according to the third embodiment.

DETAILED DESCRIPTION

In general, according to one embodiment, a magnetic resonance imaging system includes a magnetic resonance imaging apparatus and a receiving coil unit. The magnetic resonance imaging apparatus includes control circuitry and first transmitting circuitry. The control circuitry generates a first clock signal. The first transmitting circuitry transmits an RF pulse based on the first clock signal. The receiving coil unit includes clock generating circuitry, at least one receiving coil, first conversion circuitry, shift information generation circuitry and shift correction circuitry. The clock generating circuitry generates a second clock signal. The at least one receiving coil receives a magnetic resonance signal based on the RF pulse. The first conversion circuitry samples the magnetic resonance signal in accordance with the second clock signal. The shift information generation circuitry generates shift information regarding a difference between the first clock signal and the second clock signal. The shift correction circuitry corrects the sampled magnetic resonance signal by using the shift information.

The configuration of a magnetic resonance imaging (MRI) system according to the present embodiments will be described with reference to the accompanying drawing. In the description below, structural elements having substantially the same functions and configurations will be denoted by the same reference symbols. A repetitive description of such elements will be given only where necessary.

First Embodiment

The configuration of an MRI system according to the first embodiment will be explained with reference to FIG. 1.

Figure 1:
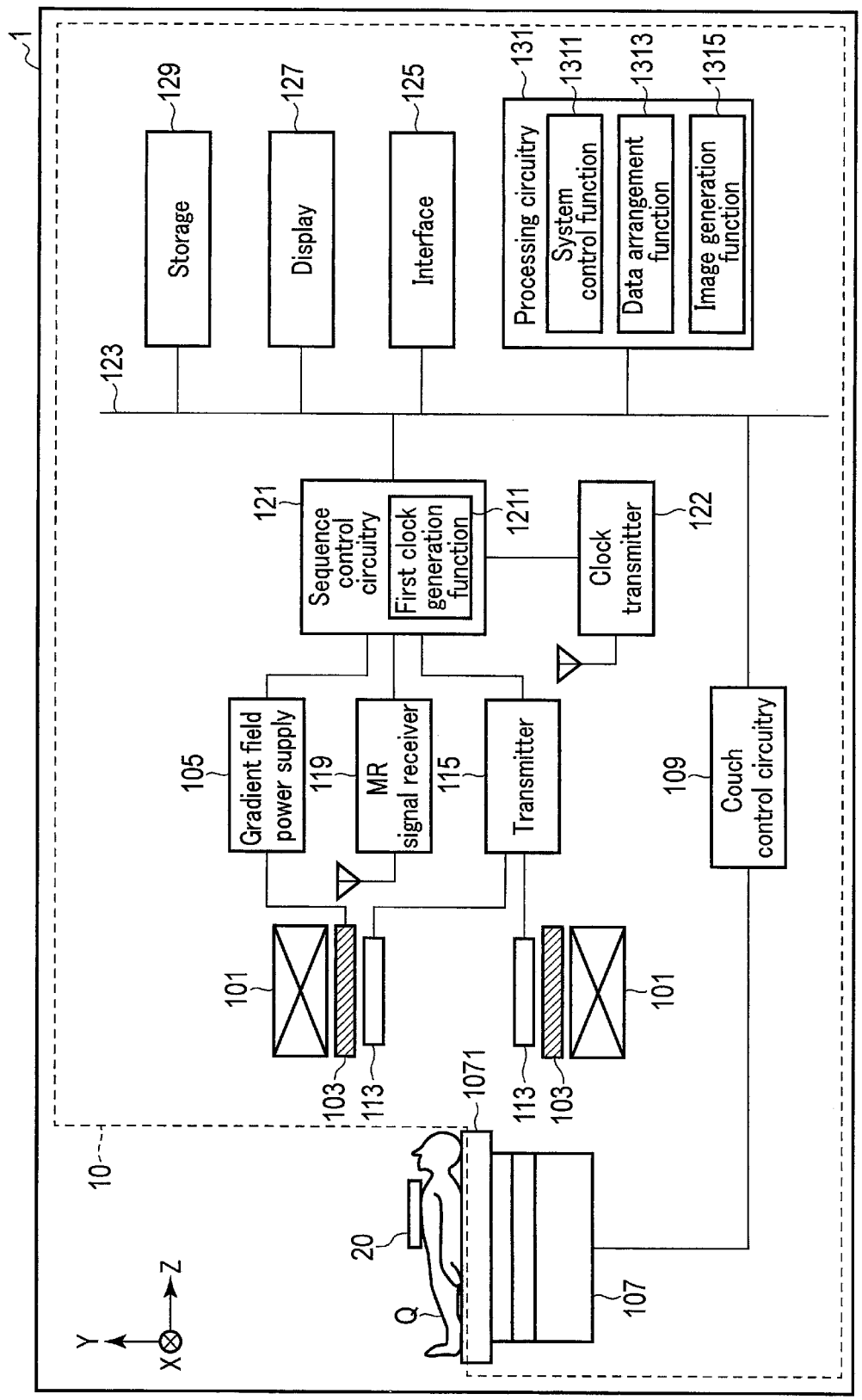
FIG. 1 is a block diagram of an MRI system according to the first embodiment.

As shown in FIG. 1, the MRI system 1 according to the first embodiment includes an MRI apparatus 10 and a receiving coil unit 20.

The MRI apparatus 10 includes a static field magnet 101, a gradient coil 103, a gradient field power supply 105, a couch 107, a couch control circuitry 109, a transmitting coil 113, a transmitter 115, an MR signal receiver 119, sequence control circuitry 121, a clock transmitter 122, a bus 123, an interface 125, a display 127, a storage 129, and processing circuitry 131. The MRI apparatus 10 may have a hollow cylindrical-shaped shim coil provided between the static field magnet 101 and the gradient coil 103.

The static field magnet 101 is a magnet formed in a hollow cylindrical shape, and generates a homogeneous static magnetic field ($B_0$) inside the hollow part. For example, a superconductive magnet, etc. may be used for the static field magnet 101.

The gradient coil 103 is a hollow cylindrical-shaped coil, and is disposed inside the static field magnet 101. The gradient coil 103 is formed by combining three coils respectively corresponding to the X-, Y-, and Z-axes which are orthogonal to each other. The Z-axis direction is defined as the same as the direction of the static magnetic field. In addition, the Y-axis direction is a vertical direction, and the X-axis direction is a direction perpendicular to each of the Z-axis and the Y-axis. These three coils in the gradient coil 103 are separately supplied with a current from the gradient field power supply 105, and respectively generate gradient fields in which magnetic field intensity changes along each of the X-, Y-, and Z-axes.

The gradient fields along each of the X-, Y-, and Z-axes generated by the gradient coil 103 respectively correspond to, for example, a slice selective gradient field, a phase encode gradient field, and a frequency encode gradient field (readout gradient field). The slice selective gradient field is used to discretionarily determine an imaging slice. The phase encode gradient field is used to change the phase of magnetic resonance (MR) signals in accordance with a spatial position. The frequency encode gradient field is used to change a frequency of an MR signal in accordance with a spatial position.

The gradient field power supply 105 is a power supply apparatus that supplies a current to the gradient coil 103 by the control of the sequence control circuitry 121.

The couch 107 is an apparatus having the table top 1071 on which a subject Q is placed. The couch 107 inserts the table top 1071 on which the subject Q is placed into a bore 111 under the control of the couch control circuitry 109. Normally, the couch 107 is installed in an examination room where the MRI apparatus 10 is installed, in such a manner that the longitudinal axis of the couch 107 is parallel to the central axis of the static field magnet 101.

The couch control circuitry 109 is circuitry for controlling the couch 107, and is implemented by a processor, for example. The couch control circuitry 109 drives the couch 107 in accordance with an operator's instruction via the interface 125 to move the table top 1071 in a longitudinal direction and a vertical direction.

The transmitting coil 113 is an RF (radio frequency) coil disposed inside the gradient coil 103. The transmitting coil 113 receives a high frequency pulse (RF pulse) from the transmitter 115, and generates transmit RF waves which correspond to a high frequency magnetic field. The transmitting coil 113 may be, for example, a whole body (WB) coil. The WB coil may be used as a transmitting/receiving coil. A cylindrical-shaped RF shield is provided between the WB coil and the gradient coil 103 to magnetically separate these coils.

The transmitter 115 supplies a high-frequency pulse modulated by a Larmor frequency to the transmitting coil 113 by the control of the sequence control circuitry 121.

The MR signal receiver 119 generates magnetic resonance data (MR data) which is digitized complex data based on the MR signals emitted from the subject Q due to a high frequency magnetic field output from the receiving coil unit 20 by the control of the sequence control circuitry 121. Specifically, the MR signal receiver 119 performs various types of signal processing such as pre-amplification, intermediate frequency conversion, phase detection, low-frequency amplification, filtering, etc. to the MR signals output from the receiving coil unit 20, and then performs analog-to-digital (A/D) conversion to the signals subjected to the signal processing. The MR signal receiver 119 executes sampling to the A/D converted data. Through this processing, the MR signal receiver 119 generates MR data. The MR signal receiver 119 outputs the generated MR data to the sequence control circuitry 121. The MR data generated by the MR signal receiver 119 may be also referred to as raw data.

The sequence control circuitry 121 controls the gradient field power supply 105, the transmitter 115, and the MR signal receiver 119, in accordance with pulse sequence information output from the processing circuitry 131, and performs imaging on the subject Q. The pulse sequence information includes a magnitude of a current supplied from the gradient field power supply 105 to the gradient coil 103, the timing of supplying a current by the gradient field power supply 105 to the gradient coil 103, a magnitude or a temporal width of an RF pulse supplied from the transmitter 115 to the transmitting coil 113, the timing of supplying an RF pulse from the transmitter 115 to the transmitting coil 113, the timing of receiving an MR signal from the MR signal receiver 119, etc. The magnitude of the current supplied from the gradient field power supply 105 to the gradient coil 103 corresponds to a waveform of the gradient field in accordance with the pulse sequence.

The sequence control circuitry 121 includes a first clock generation function 1211. The sequence control circuitry 121 activates the first clock generation function 1211 to generate a clock signal (a first clock signal) relating to the timing of supplying an RF pulse and the timing of receiving an MR signal.

The clock transmitter 122 wirelessly transmits the first clock signal output from the sequence control circuitry 121 to the receiving coil unit 20. When transmitting the first clock signal, the first clock signal is superposed on a carrier wave by one or both of amplitude modulation or frequency modulation. The amplitude modulation or the frequency modulation does not require coherent detection, and accordingly, the influence of phase shift due to the coherent detection can be prevented.

The bus 123 is a transmission path through which data is transmitted between the interface 125, the display 127, the storage 129, and the processing circuitry 131. The bus 123 may be connected to various types of living body signal measuring devices and external storage devices via a network, etc., as needed.

The interface 125 is circuitry for receiving various types of instructions and information that are input from an operator. The interface 125 is circuitry for a pointing device, such as a mouse, or for an input device, such as a keyboard, etc. The interface 125 is not limited to circuitry for physical operation members such as a mouse and a keyboard. The interface 125 also includes, for example, electric signal processing circuitry that receives an electric signal corresponding to an input operation through an external input device provided separately from the MRI apparatus 10 and outputs the received electric signal to different circuitry.

The display 127 displays various types of information, such as an MR image, etc. reconstructed by an image generation function 1315, under the control of a system control function 1311 in the processing circuitry 131. The display 127 is, for example, a CRT display, a liquid crystal display, an organic EL display, an LED display, a plasma display, any other display known in this technical field, or a monitor, etc.

The storage 129 stores MR data arranged in k-space by a data arrangement function 1313, and image data generated by the image generation function 1315, etc. The storage 129 stores various types of imaging protocols, and imaging conditions including imaging parameters that define the imaging protocols, etc. The storage 129 stores programs corresponding to the various types of functions executed by the processing circuitry 131. The storage 129 is, for example, a RAM (Random Access Memory), a semiconductor memory element such as a flash memory, a hard disk drive, a solid state drive, and an optical disk, etc. The storage 129 may be a drive, etc. configured to read and write various kinds of information with respect to a portable storage medium such as a CD-ROM drive, a DVD drive, or a flash memory, etc.

The processing circuitry 131 includes a non-illustrated processor, and a non-illustrated memory, such as a ROM or a RAM, etc. as hardware resources, to integrally control the MRI apparatus 10. The processing circuitry 131 includes the system control function 1311, the data arrangement function 1313, and the image generation function 1315. The various types of functions executed by the system control function 1311, the data arrangement function 1313, and the image generation function 1315, are stored in the storage 129 in a form of a computer-executable program. The processing circuitry 131 is a processor which reads a program corresponding to each function from the storage 129 and executes the program to activate the function corresponding to the program. In other words, the processing circuitry 131 which has read each program can activate each function shown in the processing circuitry 131 of FIG. 1.

FIG. 1 illustrates that the aforementioned functions are implemented by single processing circuitry 131; however, the processing circuitry 131 may include a plurality of independent processors, and the functions may be implemented by the processors executing respective programs. In other words, there may be a case where each of the aforementioned functions may be configured as a program, and single processing circuitry executes each program, or a case where each of the functions may be implemented in independent program-execution circuitry specific to respective functions.

The term "processor" used in the above description refers to, for example, a CPU (Central Processing Unit), a GPU (Graphics Processing Unit), or circuitry such as an ASIC (Application Specific Integrated Circuit), a programmable logic device (for example, an SPLD (Simple Programmable Logic Device), a CPLD (Complex Programmable Logic Device), or an FPGA (Field Programmable Gate Array)).

The processor realizes its function by reading and executing a program stored in the storage 129. A program may be directly integrated into the circuitry of the processor, instead of storing the program on the storage 129. In this case, the function is activated by reading and executing the program integrated into the circuitry. The couch control circuitry 109, the transmitter 115, the MR signal receiver 119, the sequence control circuitry 121, etc. are also configured as electronic circuitry, such as a processor.

The processing circuitry 131 integrally controls the MRI apparatus 10 by the system control function 1311. Specifically, the processing circuitry 131 reads a system control program stored in the storage 129, deploys the program on a memory, and controls the respective circuitry of the MRI apparatus 10 in accordance with the deployed system control program.

The receiving coil unit 20 will be described in detail, with reference to the block diagram of FIG. 2.

The receiving coil unit 20 includes second clock generation circuitry 201, a receiving coil 203, a first analog to digital converter (ADC) 205, an antenna 207, a clock receiver 209, a phase locked loop (PLL) 211, a second ADC 213, shift information generation circuitry 215, shift correction circuitry 217, an MR signal transmitter 219, and an antenna 221.

The second clock generation circuitry 201 generates a second clock signal independent from the first clock signal at the receiving coil unit 20. The second clock generation circuitry 201 will be described in detail with reference to FIG. 5.

The receiving coil 203 is an RF coil disposed inside the gradient coil 103. The RF coil is assumed to be a local receiving RF coil such as an abdomen coil which corresponds to an imaging target of the subject Q. The receiving RF coil receives an analog MR signal emitted from the subject Q.

The first ADC 205 receives an analog MR signal from the receiving coil 203, and a second clock signal from the second clock generation circuitry 201. The first ADC 205 samples the analog MR signal in accordance with the second clock signal, and generates a digital MR signal.

The clock receiver 209 receives a first clock signal wirelessly transmitted from the clock transmitter 122 at the MRI apparatus 10 side through the antenna 207. The clock receiver 209 demodulates at least one of the amplitude modulation or the frequency modulation, and generates a third clock signal. This process is performed because when the first clock signal is wirelessly transmitted, the first clock signal may not be completely demodulated due to an influence from the wireless path. Accordingly, in the present embodiment, a signal received and modulated at the clock receiver 209 is defined as an analog third clock signal.

The PLL 211 receives the analog third clock signal from the clock receiver 209, and corrects irregular fluctuation of frequency from the third clock signal. The operation of the PLL may be the same as that of the general PLL, and the explanation will be omitted.

The second ADC 213 receives the corrected analog third clock signal from the PLL 211, and the second clock signal from the second clock generation circuitry 201. The second ADC 213 samples the analog third clock signal in accordance with the second clock signal, and generates a digital third clock signal.

The shift information generation circuitry 215 receives the second clock signal and the digital third clock signal from the second ADC 213, and generates shift information based on the second clock signal and the digital third clock signal. The shift information includes information regarding a phase shift and a frequency shift.

The shift correction circuitry 217 receives the digital MR signal from the first ADC 205, and the shift information from the shift information generation circuitry 215. The shift correction circuitry 217 corrects the digital MR signal based on the shift information.

The MR signal transmitter 219 receives the corrected MR signal from the shift correction circuitry 217, and transmits the corrected MR signal to the MRI apparatus 10 through the antenna 221.

Next, an example of the demodulation process of a clock signal received by wireless communication at the clock receiver 209 will be described with reference to FIGS. 3 and 4.

Figure 3:
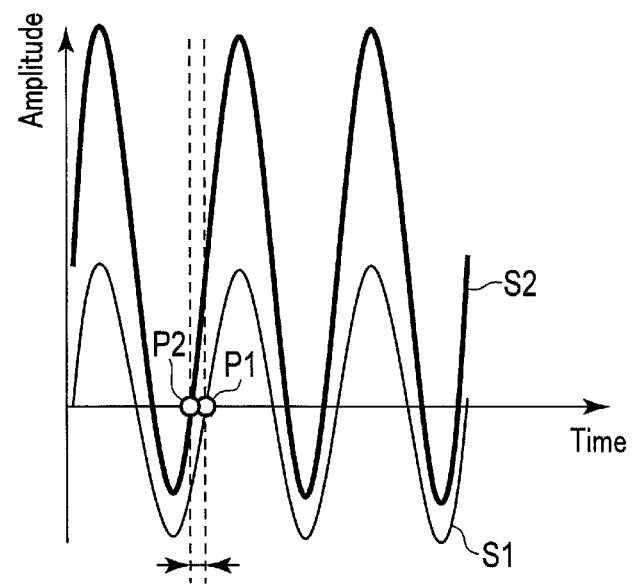
FIG. 3 illustrates an example of a clock waveform received at a clock receiver.

FIG. 3 illustrates a waveform of a clock signal (also referred to as a clock waveform) received at the clock receiver 209. The horizontal axis represents time, and the vertical axis represents amplitude.

In the case where the first clock signal is subjected to amplitude modulation, the clock receiver 209 may perform envelope detection when performing demodulation. If it is assumed that the clock receiver 209 obtains a clock waveform S2 by performing envelope detection to the received first clock signal, DC offset occurs to an original clock waveform S1 of the first clock signal. Due to the occurrence of the DC offset, a shift may be generated between a reference amplitude position P1 of the clock waveform S1 and a reference amplitude position P2 of the clock waveform S2. In this case, an AC coupling circuit may be provided to perform AC coupling after the envelope detection.

Figure 4:
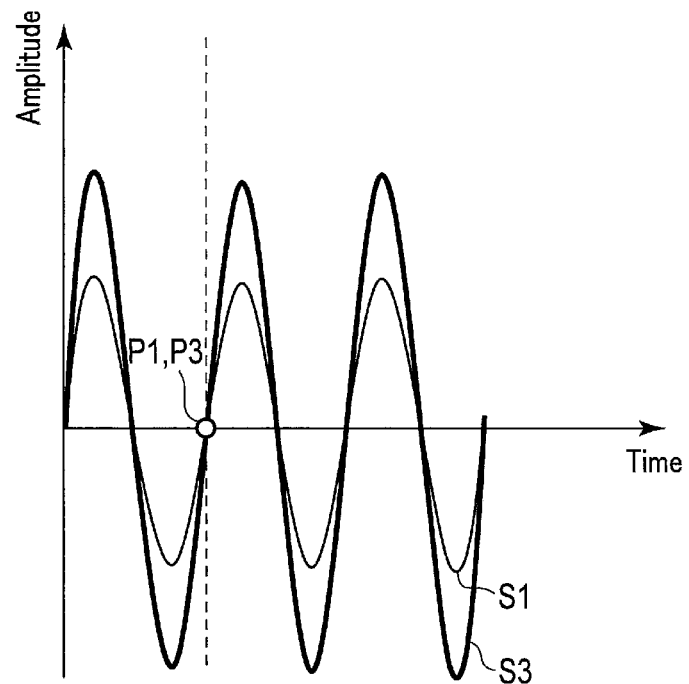
FIG. 4 illustrates an example of a clock waveform after AC coupling.

A clock waveform after the AC coupling is performed is illustrated in FIG. 4.

A clock waveform S3 is a waveform after AC coupling. As shown in FIG. 4, even in the case where amplitude is changed relative to the original clock waveform S1 by envelope detection, the clock waveform S1 and the clock waveform S3 are in phase at the reference amplitude position P1 and a reference amplitude position P3, and phase shift is mitigated.

In the case where the first clock signal is subjected to frequency modulation, and demodulation is performed to the first clock signal, a non-illustrated frequency discriminator may be provided. The frequency discriminator converts a frequency change to an amplitude change, allowing for the processing similar to the above to be performed.

Figure 5:
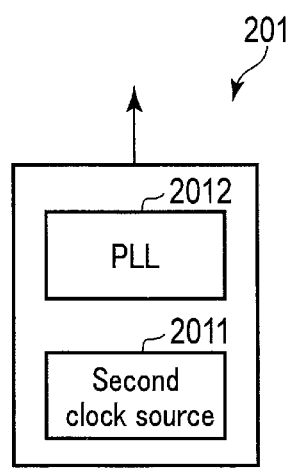
FIG. 5 is a block diagram illustrating a second clock generation circuitry.

The second clock generation circuitry 201 that generates a second clock signal used at the receiving coil unit 20 will be described in detail with reference to the block diagram of FIG. 5.

The second clock generation circuitry 201 includes a second clock source 2011 and a PLL 2012.

The second clock source 2011 is, for example, an oscillator which generates an oscillation signal.

The PLL 2012 receives the oscillation signal from the second clock source 2011, and multiplies the oscillation signal to generate a second clock signal. The second clock generation circuitry 201 may not include the second clock source 2011. In this case, the second clock generation circuitry 201 may acquire an oscillation signal from an external oscillator and generate a second clock signal.

The second clock signal is set to have a higher frequency than the first clock signal, preferably, an integer multiple of the frequency of the first clock signal. By setting the frequency of the second clock signal used for sampling to be higher than the frequency of the first clock signal, a shift between the first clock signal and the second clock signal can be easily distinguished. By setting the frequency of the second clock signal to be an integer multiple of the frequency of the first clock signal, increase of the number of positive half cycles of a clock signal (also referred to as the number of cycles, or the number of peaks) described below and the total number of sampling points can be obtained as integer numbers, and accordingly data processing is facilitated.

Figure 6:
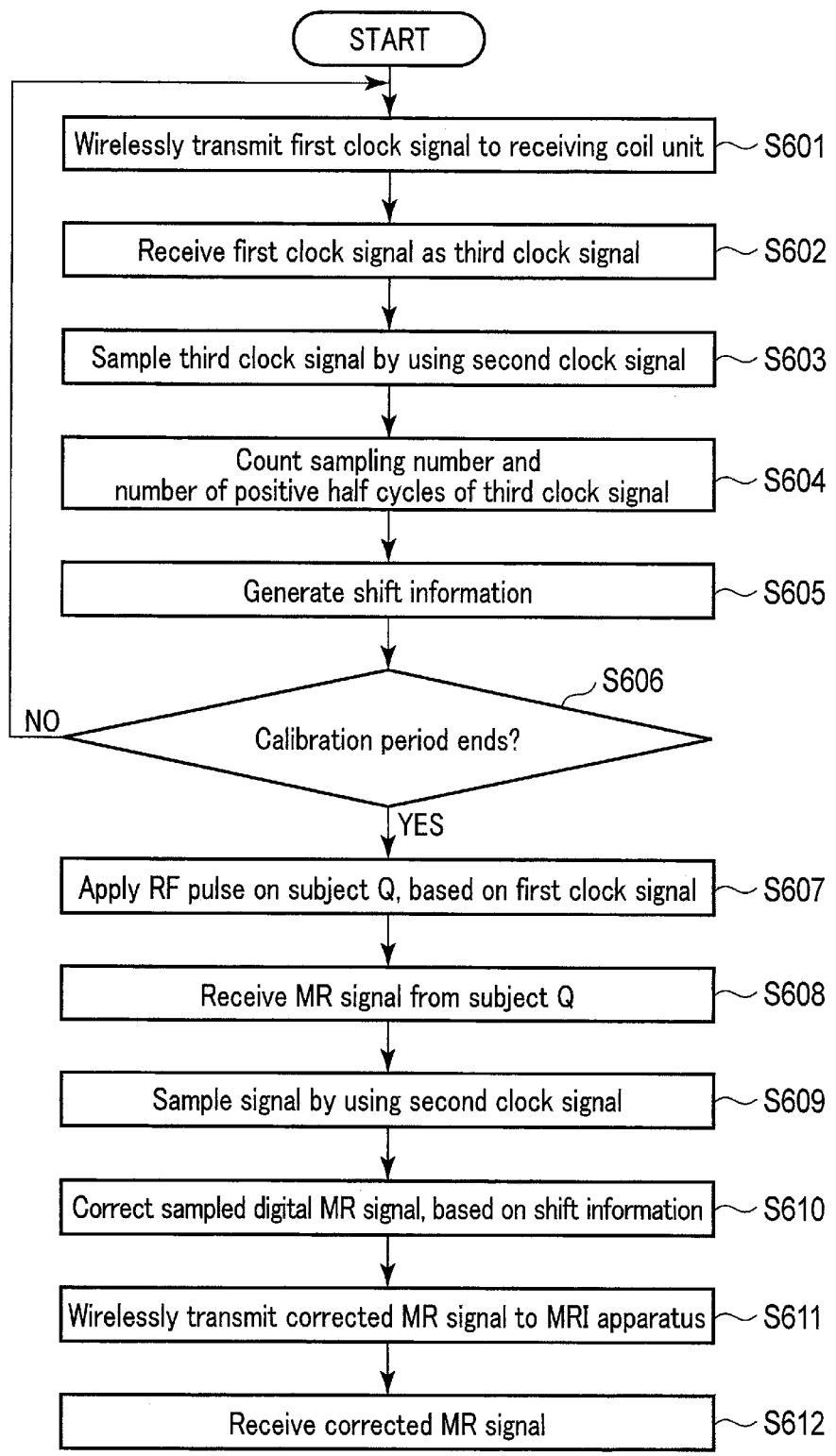
FIG. 6 is a flowchart of a data acquiring operation for a magnetic resonance imaging system.

The data acquisition of the magnetic resonance imaging system according to the first embodiment will be described with reference to the flowchart of FIG. 6.

It is assumed that a prescan is performed to set imaging conditions prior to the main steps. For example, the processing circuitry 131 may set the imaging conditions by reading imaging conditions stored in the storage 129, in response to an operator's instruction input through the interface 125. The imaging conditions may include, for example, an imaging target of a subject, an imaging time, imaging sequence information, etc.

In step S601, the clock transmitter 122 of the MRI apparatus 10 wirelessly transmits a first clock signal to the receiving coil unit 20.

In step S602, the clock receiver 209 of the receiving coil unit 20 receives the first clock signal as a third clock signal.

In step S603, the second ADC 213 of the receiving coil unit 20 samples the third clock signal in accordance with a second clock signal.

In step S604, the shift information generation circuitry 215 of the receiving coil unit 20 counts the total number of sampling points of the third clock signal and the number of positive half cycles of the third clock signal.

In step S605, the shift information generation circuitry 215 of the receiving coil unit 20 generates shift information based on the total number of sampling points of the third clock signal and the number of positive half cycles, of the third clock signal.

In step S606, the sequence control circuitry 121, for example, determines whether or not a calibration period has ended. The determination of the end of the calibration period may be performed by measuring an elapsed time from the start of the calibration period by a timer, etc., and determining that the calibration period has ended if the elapsed time exceeds a predetermined time period. If it is determined that the calibration period has ended, the process proceeds to step S607. Alternatively, if it is determined that the calibration period has not ended, steps S601 to S605 are repeated.

In step S607, the transmitting coil 113 of the MRI apparatus 10 applies RF pulses on the subject Q, based on the first clock signal.

In step S608, the receiving coil 203 of the receiving coil unit 20 receives an MR signal from the subject Q.

In step S609, the first ADC 205 of the receiving coil unit 20 samples the MR signal in accordance with the second clock signal.

In step S610, the shift correction circuitry 217 of the receiving coil unit 20 corrects the sampled digital MR signal to approximate the state sampled in accordance with the first clock signal, based on the shift information.

In step S611, the MR signal transmitter 219 of the receiving coil unit 20 wirelessly transmits the corrected MR signal to the MRI apparatus 10.

In step S612, the MR signal receiver 119 of the MRI apparatus 10 receives the corrected MR signal. If a flag is attached to a head of the corrected MR signal (or a head is tagged), an initial position of the MR signal can be determined, and accordingly, a propagation environment influence is eliminated for the wireless communication of the MR signal between the MR signal transmitter 219 and the MR signal receiver 119.

Steps S607 to S612 are repeated until the imaging sequence ends.

The shift information generation process at the shift information generation circuitry 215 will be described with reference to FIGS. 7 to 18.

First, a concept of shift in a clock signal assumed in the present embodiment will be described with reference to FIGS. 7 and 8.

Figure 7:
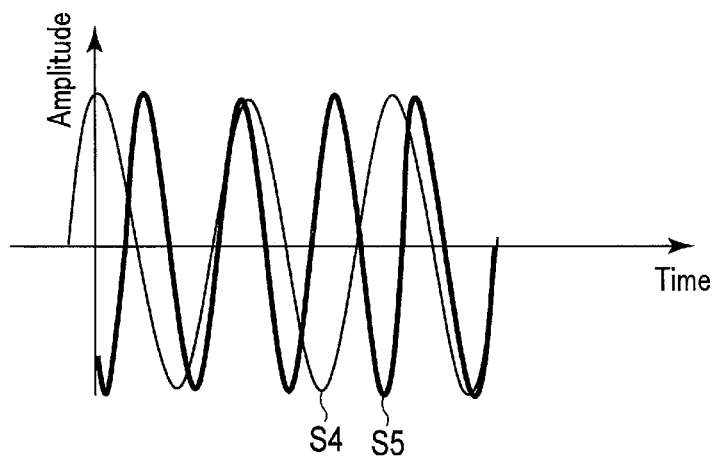
FIG. 7 illustrates examples of clock waveforms of different frequencies.

FIG. 7 illustrates clock waveforms S4 and S5. The abscissa represents time, and the ordinate represents amplitude. FIG. 8 illustrates time-phase characteristics of each clock waveform shown in FIG. 7.

Figure 8:
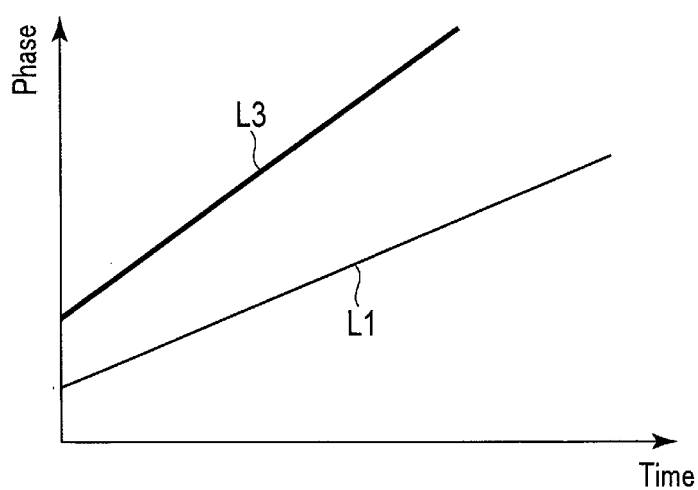
FIG. 8 illustrates time-phase characteristics of each clock waveform shown in FIG. 7.

As shown in FIG. 8, a line L1 indicates phase characteristics of a clock waveform S4, and a line L3 indicates phase characteristics of a clock waveform S5. The line L1 and the line L3 have different slopes, which indicates that the clock waveform S4 and the clock waveform S5 differ in frequency. The phase shift between the lines L1 and L3 becomes greater as time passes.

In the lines L1 and L3, the phase at time t is represented as $\varphi_1(t)$ and $\varphi_3(t)$, the relational expression between frequency $f_1$ and frequency $f_3$ is given by equations (1) and (2) below.

$$\varphi_1(t) = 2\pi f_1 t \quad (1)$$

$$\varphi_3(t) = 2\pi f_3 t \quad (2)$$

Accordingly, the phase shift $\Delta\varphi$ is given by equation (3) below.

$$\Delta\varphi = \varphi_1(t) - \varphi_3(t) \quad (3)$$

That is, the phase shift in FIG. 8 can be obtained by calculating a difference between L1 and L3 at each time. On the other hand, the frequency shift $\Delta f$ can be obtained by calculating a difference between slopes of L1 and L3 by equation (4) below.

$$\Delta f = \frac{1}{2\pi}\left(\frac{\phi_1(t)}{t} - \frac{\phi_3(t)}{t}\right) \quad (4)$$

FIG. 9 illustrates an example of the counting process at the shift information generation circuitry 215.

In FIG. 9, sampling points 901 indicate sampling points of the digital third clock signal sampled by the second ADC 213. A clock waveform S6 indicated by a broken curve is a clock waveform whose reproduction is based on the digital third clock signal.

The shift information generation circuitry 215 counts the number of sampling points 901 of the clock waveform S6, and obtains a count value. The shift information generation circuitry 215 continues counting of the sampling points 901 while the third clock signal is observed.

Next, the shift information generation circuitry 215 counts the number of cycles of the digital third clock signal. FIG. 10 illustrates the first example of a method of counting positive half cycles of a clock waveform.

FIG. 10 illustrates the clock waveform S6 as shown in FIG. 9. The shift information generation circuitry 215 sets a threshold value 1001, and counts a sampling point 1002 at a rising edge, which is a point where an amplitude value of the clock waveform S6 exceeds the threshold value 1001 for a first cycle. Next, the shift information generation circuitry 215 counts a sampling point 1003 at a rising edge, which is a point where an amplitude value of the clock waveform S6 exceeds the threshold value 1001 again after falling below the threshold value 1001 for a second cycle. That is, the number of positive half cycles of the clock waveform S6 is counted by counting the number of rising edges where the amplitude value exceeds the threshold value of the clock waveform S6. The above process continues until the observation of the third clock signal ends.

Figure 11:
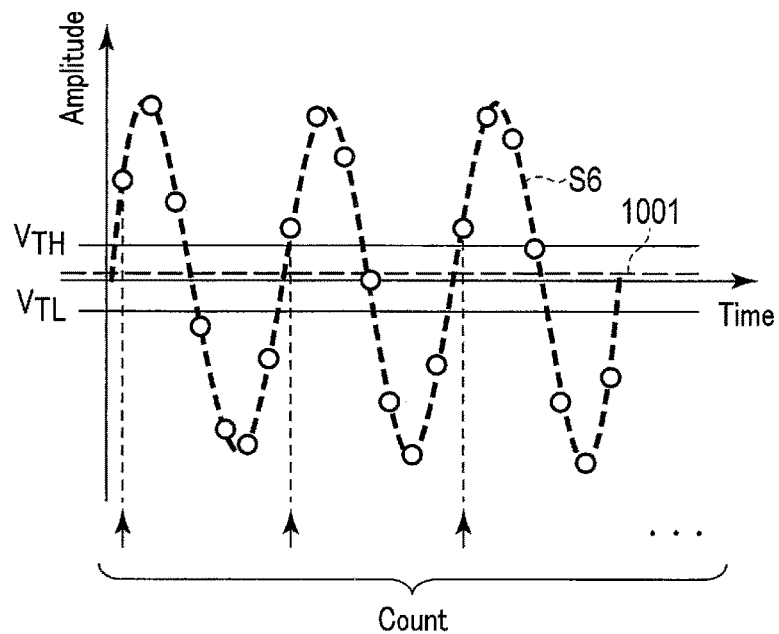
FIG. 11 illustrates the second example of a method of counting positive half cycles of a clock waveform.

FIG. 11 illustrates the second example of a method of counting positive half cycles of a clock waveform.

In the case where the counting method of FIG. 10 is applied, there may be a case where an error occurs depending on the noise level of the third clock signal. In this case, digital hysteresis comparators ($V_{TH}$ and $V_{TL}$) may be provided relative to a threshold value, as shown in FIG. 11. If a sampling point at a rising edge in the clock waveform S6 exceeds a value of $V_{TH}$, a positive half cycle may be counted. In this method, error detection due to noise can be inhibited.

Figure 12:
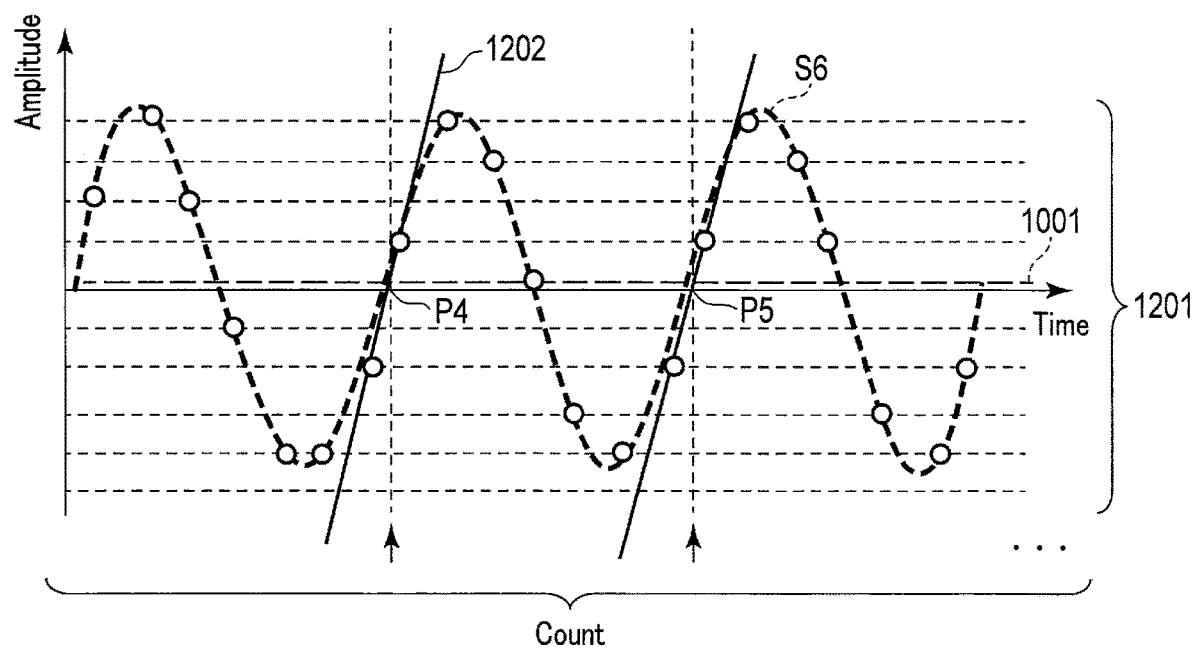
FIG. 12 illustrates the third example of a method of counting positive half cycles of a clock waveform.

FIG. 12 illustrates the third example of a method of counting positive half cycles of a clock waveform.

As shown in FIG. 12, a plurality of threshold values 1201 are provided relative to amplitude values of a clock waveform S7, and level information of the amplitude values is obtained. Linear interpolation is performed to two sampling points, and a line 1202 is obtained. It may be possible to determine an intersection of the line 1202 and the threshold value 1001 as a rising edge of a positive half cycle, and to count the number of positive half cycles of the clock waveform S6.

Figure 13:
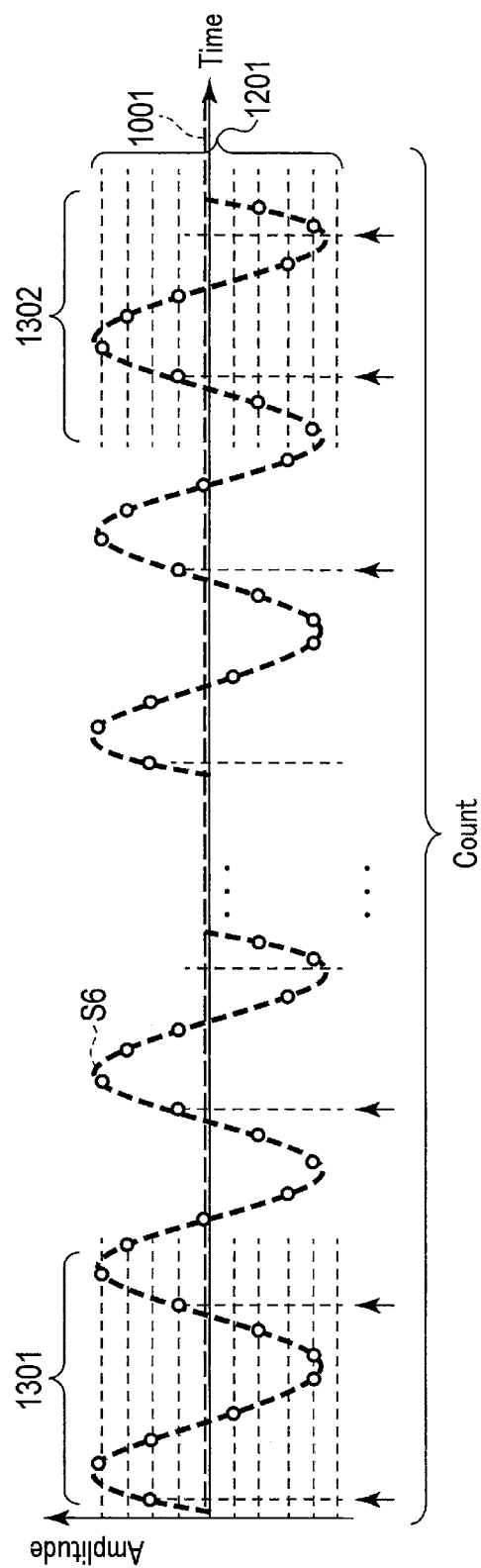
FIG. 13 illustrates the fourth example of a method of counting positive half cycles of a clock waveform.

FIG. 13 illustrates the fourth example of a method of counting positive half cycles of a clock waveform.

In the fourth example, for a predetermined period 1301 from the start of observation of the third clock signal and for a predetermined period 1302 before the end of observation of the third clock signal, the third example of the counting method which uses multiple threshold values 1201 is applied. On the other hand, for time periods other than the predetermined periods 1301 and 1302, namely, time periods in which the third example of the counting method is not applied, any counting methods, for example, the first example of counting method that uses a threshold value, may be applied.

The number of positive half cycles may be counted by combining the second and third examples of the counting method.

The phase characteristics represented by the number of positive half cycles and the number of sampling points of the clock waveform of the third clock signal will be described with reference to FIGS. 14 and 15.

FIG. 14 illustrates phase characteristics of the waveform of a digital third clock. In the present embodiment, since positive half cycles are counted at a rising edge of a clock waveform, sampling points obtained until the next positive half cycle are counted are in the same cycle. That is, in the examples shown in FIGS. 9 to 13, seven sampling points 901 are positioned in a cycle. Accordingly, the phase characteristics are represented by a stepwise graph in which a cycle is indicated by seven points, as shown in FIG. 14.

It is assumed that as the third clock signal is observed for a certain lengthy amount of time (for example, one minute or more), the phase characteristics for sampling points from the start time of observation of the third clock signal to the end of the observation will be as shown in the graph of FIG. 15. A measured value 1501 of the third clock signal can be observed macroscopically and can be assumed to be a line rising substantially to the right and indicating a proportional relationship to time. Accordingly, by observing the clock signal for a long time, influence of irregular fluctuation of the third clock signal can be mitigated.

Figure 16:
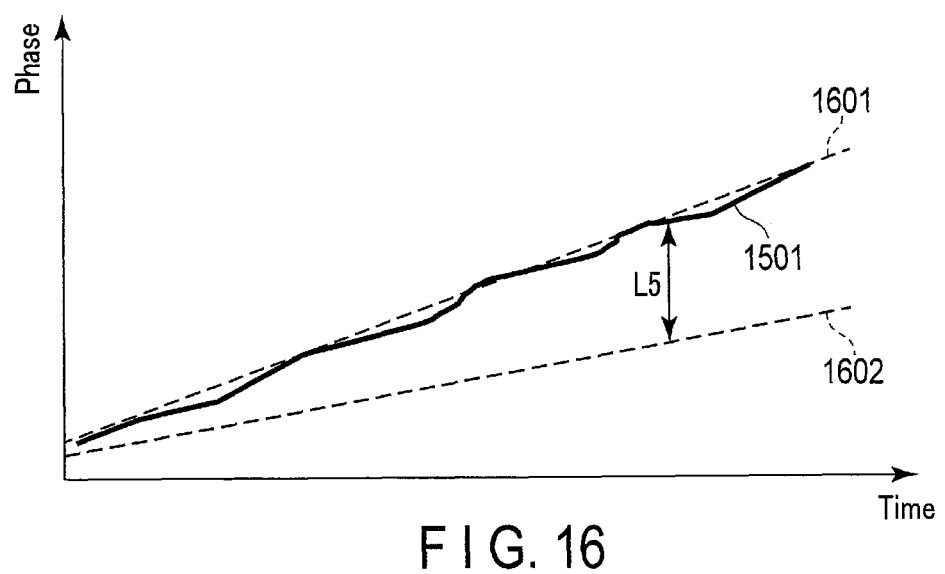
FIG. 16 illustrates an example of a method of calculating a phase shift at shift information generation circuitry.

FIG. 16 illustrates an example of a method of calculating a phase shift at the shift information generation circuitry 215.

FIG. 16 shows a graph in which the phase characteristics of the second clock signal are plotted in addition to the graph of FIG. 15.

The shift information generation circuitry 215 performs linear approximation to the measured values 1501 of the third clock signal to obtain estimation values 1601 of the phase characteristics of the first clock signal. The phase characteristics of the second clock signal are plotted by using measured values 1602 of the second clock source 2011 as shown in FIG. 5. Since the second clock signal is generated at the receiving coil unit 20, the measured values 1602 of the second clock signal can be obtained as true values, not estimation values.

That is, the shift information generation circuitry 215 may calculate a phase shift L5 between the first clock signal and the second clock signal by calculating, at a certain time point based on equation (3), a difference between an estimation value 1601 of the first clock signal and a measured value 1602 of the second clock signal.

Figure 17:
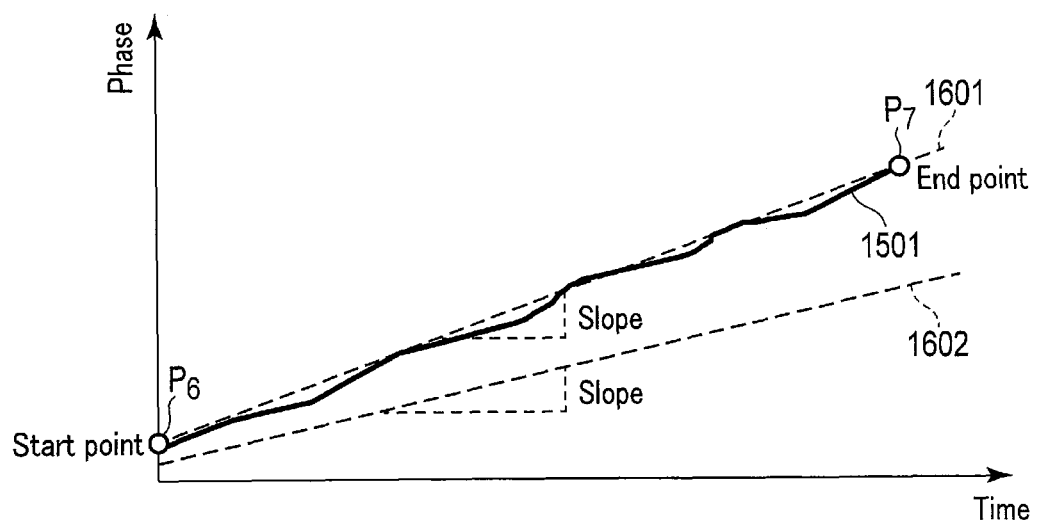
FIG. 17 illustrates an example of a method of calculating a frequency shift at shift information generation circuitry.

FIG. 17 illustrates a method of calculating a frequency shift at the shift information generation circuitry 215.

The shift information generation circuitry 215 may calculate a frequency shift between the first clock signal and the second clock signal by calculating a difference in slope between estimation values 1601 of the first clock signal and measured values 1602 of the second clock signal based on equation (4).

When calculating the slope of the estimation values 1601 of the first clock signal, it is preferable to calculate the slope based on data at the starting point of observation of the third clock signal and data at the end point of the observation to minimize the influence of the frequency fluctuation. The end point of the third clock signal observation may be a rising edge, namely, the point where the positive half cycle of the second clock signal is counted.

In the case where the shift information generation circuitry 215 calculates an estimation value of the phase of the first clock signal, the counting method as explained by referring to FIGS. 9 to 13 may be applied. That is, if the number of positive half cycles of the third clock signal counted during an observation time period t is m, the cycle of the third clock signal can be approximated by t/m. Accordingly, the relationship between an estimated phase $\varphi_4(t)$ and a frequency $f_4$ of the third clock signal for time period t is represented by equation (5).

$$\varphi_4(t) = 2\pi f_4 t \approx 2\pi \times m \quad (5)$$

If the phase estimation is performed by using multiple threshold values 1201 as shown in FIG. 12, without simplifying the calculation process, the phase can be estimated more accurately. Thus, the shift information generation circuitry 215 may calculate the phase shift by using the estimated phase.

Figure 18:
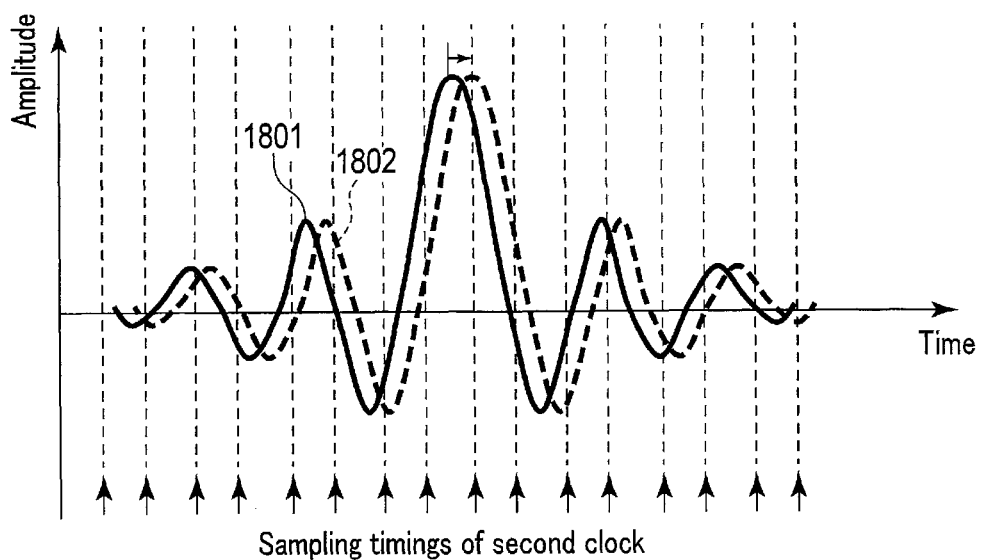
FIG. 18 is a diagram to explain correction processing at shift correction circuitry.

The correction processing of the shift correction circuitry 217 will be described with reference to FIG. 18.

Since an MR signal is sampled at the receiving coil unit in accordance with the second clock signal independent from the first clock signal at the system side, it is not assumed that the second clock signal is irregularly fluctuating due to the influence of the wireless communication path.

Thus, the shift correction circuitry 217 multiplies a digital MR signal 1801 sampled in accordance with the second clock signal by a complex $e^{j\Delta\theta}$ so as to be in phase with the estimation value of the phase of the first clock signal, based on the shift information, and calculates a corrected MR signal 1802.

Modification of First Embodiment

The aforementioned shift information is assumed to be generated based on the third clock signal observed during the calibration period prior to the main measurement. However, the observation of the third clock signal may be continued in the main measurement period after the calibration period. By using the third clock signal during the main measurement period, the shift information generation circuitry 215 can generate shift information in which the influence of the propagation environment during the main measurement period is accounted.

Figure 19:
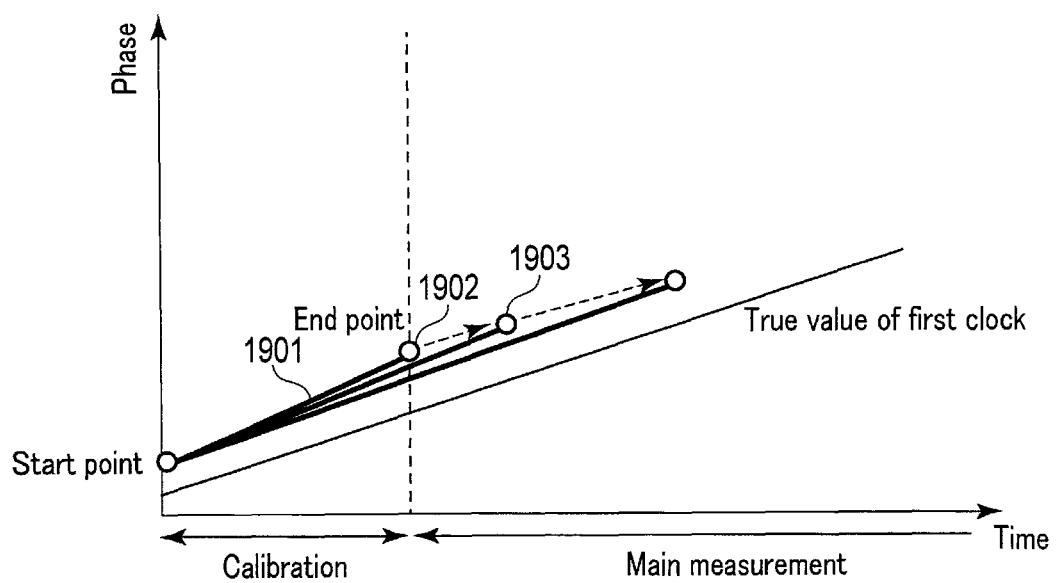
FIG. 19 illustrates the first update example of shift information.

The first update example of the shift information is shown in FIG. 19.

FIG. 19 is a graph of phase characteristics where a start point of estimation values 1901 of the first clock signal is fixed, and an end point is updated based on the sampling values during the main measurement. That is, the shift information generation circuitry 215 calculates shift information based on the slope of the line connecting the start point and an end point 1902 during the calibration period. The shift information generation circuitry 215 updates the end point 1902 to a newly obtained sampling value as an end point 1903 of the estimation values 1901 of the first clock signal during the main measurement period. Thereafter, the shift information generation circuitry 215 may update the shift information based on the slope of the line connecting the start point and the end point 1903.

Whether or not the end point should be updated is to be determined as indicated below. For example, the shift information generation circuitry 215 calculates a difference in the slope between the estimation values 1901 of the first clock signal during the calibration period and the estimation values 1901 of the first clock signal during the main measurement period. The shift information generation circuitry 215 may determine that an error of estimation values during the calibration period is not in an acceptable range, if the difference is equal to or greater than a threshold value, and may update the end point. It may be possible to progressively update the slope by using the sampling point obtained at predetermined time intervals in the main measurement. Through this process, estimation may become closer to the true value of the first clock signal as indicated by a solid line. Namely, highly accurate estimation can be achieved.

Figure 20:
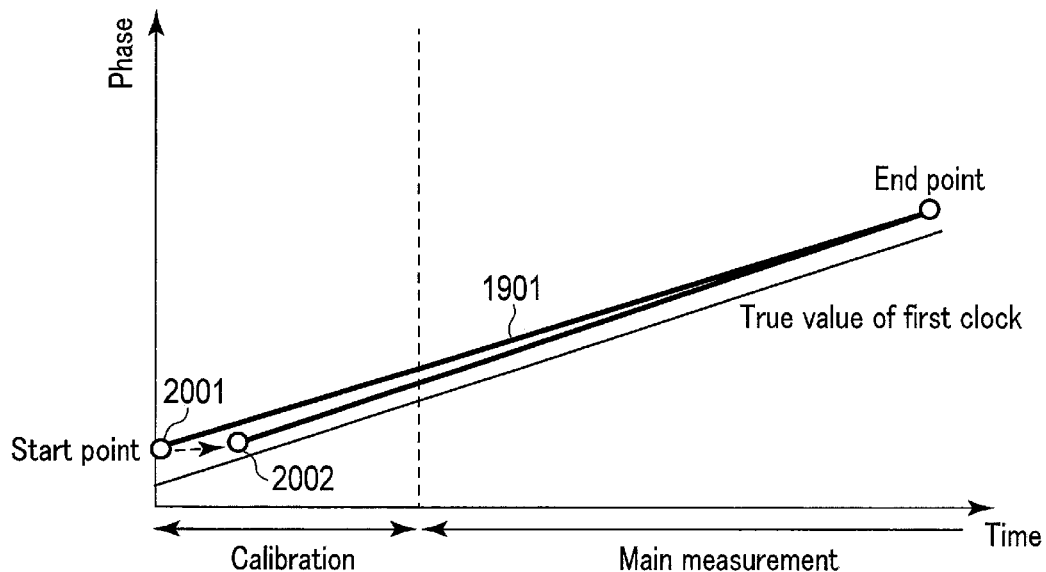
FIG. 20 illustrates the second update example of shift information.

The second update example of the shift information is shown in FIG. 20.

In FIG. 19, the end point of the estimation values 1901 of the first clock signal is updated, whereas, in FIG. 20, the end point is fixed with a particular sampling point, and a start point 2001 of the estimation values 1901 of the first clock signal is updated. The shift information generation circuitry 215 may update a start point 2001 to a sampling point after a predetermined time has elapsed as a start point 2002. Whether or not the start point should be updated is determined by a similar process to the determination of the end point update. By the second update example, the estimation accuracy of the estimation values 1901 of the first clock signal can be suitably improved also.

Figure 21:
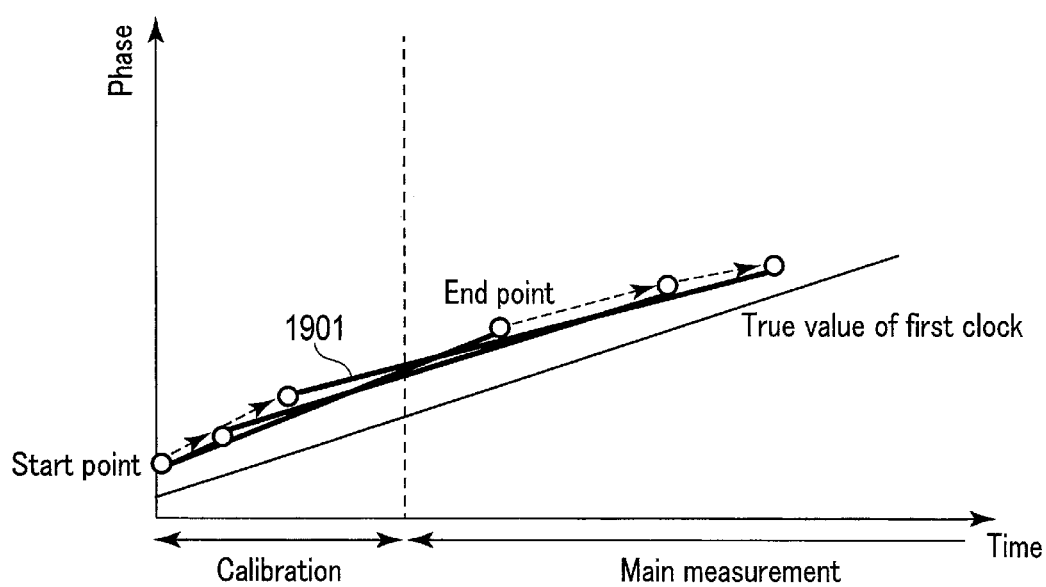
FIG. 21 illustrates the third update example of shift information.

The third update example of the shift information is shown in FIG. 21.

In the example shown in FIG. 21, the shift information generation circuitry 215 updates both of the start point and the end point of the first clock signal. By the third update example, the estimation accuracy of the estimation values 1901 of the first clock signal can be suitably improved as well.

Instead of updating only the estimation values of the first clock signal, it may be possible to adjust the frequency of the second clock signal in accordance with the estimation values of the first clock signal. FIG. 22 illustrates the first adjustment example of the second clock signal.

FIG. 22 illustrates the estimation values 1901 of the first clock signal, the true values of the first clock signal indicated by a broken line, the second clock signal 2201, and the initial values (predetermined values) of the second clock indicated by a broken line.

The shift correction circuitry 217 generates correction information to correct the frequency and the phase of the second clock signal to match the estimation values 1901 of the first clock signal, and sends the correction information to the second clock generation circuitry 201. The second clock generation circuitry 201 may change the frequency and the phase of the second clock signal based on the received correction information, and generate an updated second clock signal 2201.

In the example of FIG. 22, the second clock generation circuitry 201 may increase the frequency of the second clock signal in the main measurement in accordance with the phase of the estimation values 1901 of the first clock signal during the calibration period.

FIG. 23 illustrates the second adjustment example of the second clock signal.

As shown in FIG. 23, every time the estimation values of the first clock signal are updated, the frequency and the phase of the second clock signal may be changed in accordance with the updated estimation values.

Specifically, a second clock signal 2201 in which the frequency is changed (increased) in accordance with the estimation values 1901 of the first clock signal is used in the initial stage of the main measurement period. Subsequently, if the estimation values of the first clock signal are updated during the main measurement period, and estimation values 2301 are generated, the shift information generation circuitry 215 generates the correction information. The second clock generation circuitry 201 may alter (decrease) the frequency of the second clock signal 2201 based on the correction information of the updated estimation values 2301, and generate an updated second clock signal 2302.

In the case where the second clock signal is adjusted as shown in FIGS. 22 and 23, an MR signal is sampled in accordance with the second clock signal in which the shift relative to the estimation values of the first clock signal is corrected, and accordingly, correction processing will already have been performed. Thus, the shift correction circuitry 217 does not perform shift correction, and the MR signal transmitter 219 may transmit the sampled MR signal to the MRI apparatus 10.

According to the first embodiment, the MRI apparatus 10 transmits a first clock signal used for application of RF pulses to the receiving coil unit 20. The receiving coil unit 20 generates shift information by using a wirelessly transmitted first clock signal and a second clock signal which is higher in frequency than the first clock signal, and corrects an MR signal based on the shift information. Through the above process, clock synchronization is achieved with high accuracy without being affected by the influence of the wireless communication path. As a result, an RF pulse that uses the first clock signal is associated with an MR signal generated by the RF pulse, and accordingly, the MRI apparatus can generate a high definition MR image.

Second Embodiment

In the second embodiment, it is assumed that a plurality of receiving coils are provided to correspond to each of the plurality of channels.

The receiving coil unit 20 according to the second embodiment will be explained with reference to the block diagram of FIG. 24.

Figure 2:
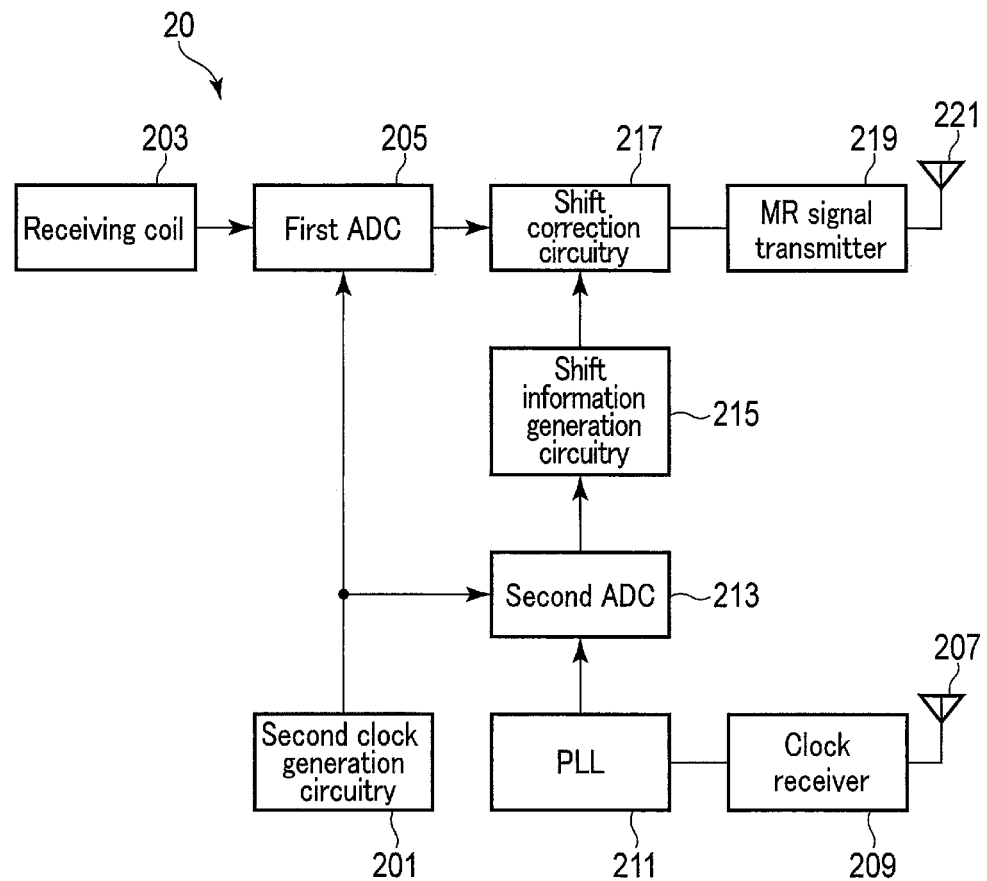
FIG. 2 is a block diagram of a receiving coil unit according to the first embodiment.

The receiving coil unit 20 shown in FIG. 24 includes a plurality of receiving coils 203, a plurality of first ADCs 205, a plurality of shift correction circuitry 217, and a digital multiplexer 223, in addition to the elements shown in FIG. 2. The explanation of the same elements will be omitted.

A receiving coil 203-1, a first ADC 205-1, and shift correction circuitry 217-1 are associated with a first receiving channel; and a receiving coil 203-2, a first ADC 205-2, and shift correction circuitry 217-2 are associated with a second receiving channel. Accordingly, an Nth receiving channel (N is a natural number of three or more) is associated with an Nth receiving coil 203-N, a Nth first ADC 205-N, and Nth shift correction circuitry 217-N.

The digital multiplexer 223 receives a sampled digital MR signal from each shift correction circuitry 217. The digital multiplexer 223 generates a multiplexed signal by adding a plurality of sampled digital MR signals. When generating the multiplexed signal, an MR signal from each receiving coil (receiving channel) is distinguished. The multiplexing process of MR signals acquired by the receiving channels may be performed by the general method.

The MR signal transmitter 219 wirelessly transmits the multiplexed signal to the MRI apparatus 10.

The MRI apparatus 10 divides the multiplexed signal into signals for each receiving channel. The process for demultiplexing may be performed by a general method.

According to the second embodiment, even in the case where a plurality of receiving coils are provided, the shift between the first clock signal and the second clock signal can be corrected with high accuracy by the shift correction circuitry, in a similar manner to the first embodiment. Therefore, clock synchronization is achieved with high accuracy without being affected by the influence of the wireless communication path.

Third Embodiment

In the above embodiments, the shift between the first clock signal and the second clock signal is corrected at the receiving coil unit 20 side. However, the shift may be corrected at the MRI apparatus 10 side.

The MRI system 1 according to the third embodiment will be explained with reference to the block diagram of FIGS. 25 and 26.

Figure 25:
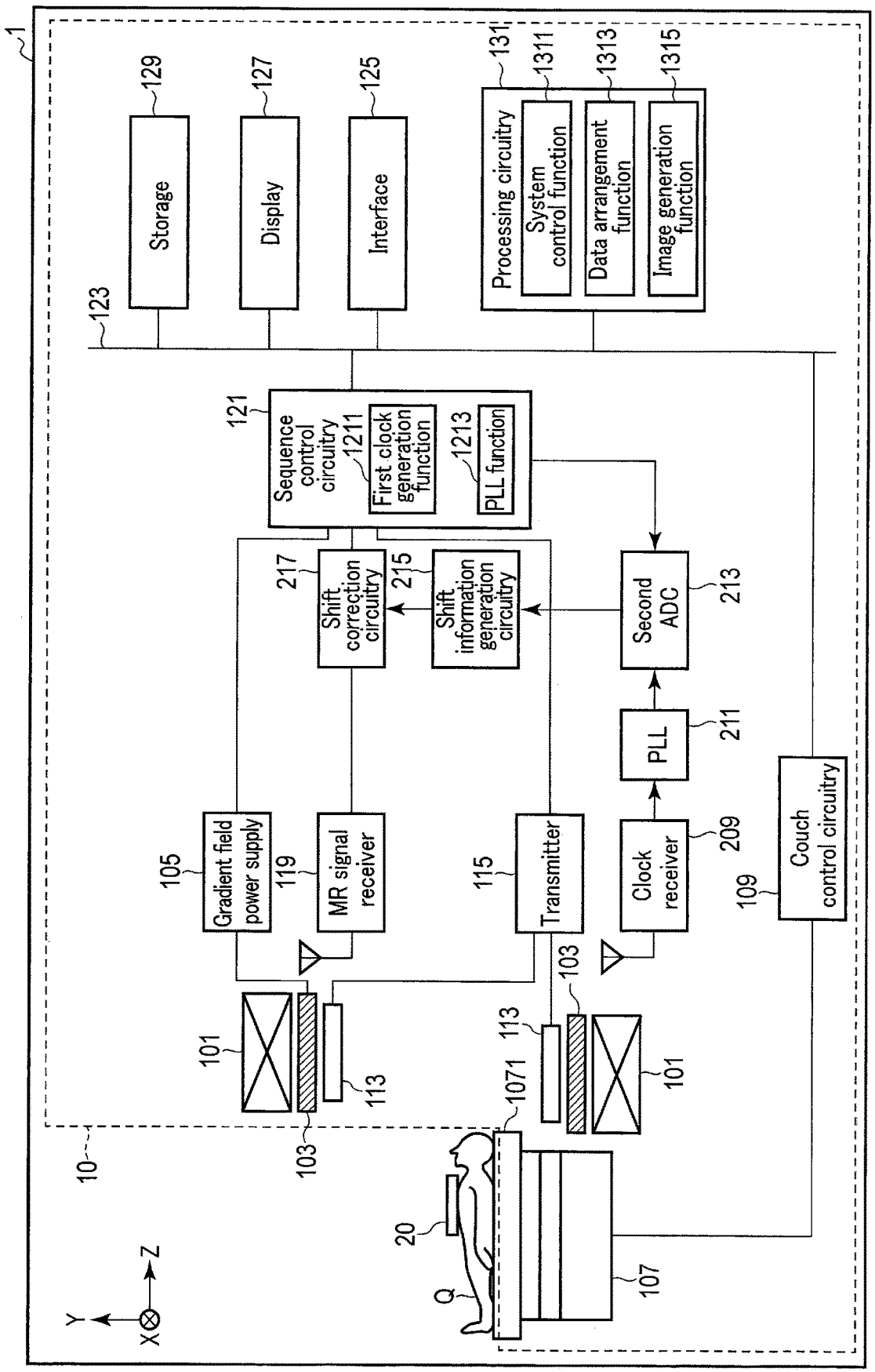
FIG. 25 is a block diagram of an MRI system according to the third embodiment.

The MRI apparatus 10 shown in FIG. 25 includes the clock receiver 209, the PLL 211, the second ADC 213, the shift information generation circuitry 215, the shift correction circuitry 217, and a PLL function 1213 included in the sequence control circuitry 121, in addition to the elements shown in FIG. 1.

The receiving coil unit 20 as shown in FIG. 26 eliminates the clock receiver 209, the PLL 211, the second ADC 213, the shift information generation circuitry 215, and the shift correction circuitry 217 from the receiving coil unit 20 shown in FIG. 2, and includes clock transmitter 122 in addition to the elements of the receiving coil unit 20 shown in FIG. 2.

In the receiving coil unit 20, the clock transmitter 122 transmits a second clock signal to the MRI apparatus 10.

The MR signal transmitter 219 receives a digital MR signal from the first ADC 205. The MR signal transmitter 219 transmits the digital MR signal to the MRI apparatus 10.

In the MRI apparatus 10, the PLL function 1213 of the sequence control circuitry 121 multiplies a first clock signal, and generates a fifth clock signal which has a frequency higher than a frequency of the second clock signal. It is preferable that the fifth clock signal is multiplied to be an integer multiple of the second clock signal in frequency.

The clock receiver 209 receives the second clock signal wirelessly transmitted from the clock transmitter 122 at the receiving coil unit 20 side, and generates an analog fourth clock signal. The analog fourth clock signal is a signal effected by the influence of wireless communication path due to the wirelessly transmitted second clock signal, which is similar to the analog third clock signal.

The PLL 211 performs processing similar to that performed in the case where the PLL 211 is included in the receiving coil unit 20, in order to correct fluctuations in frequency of the analog fourth clock signal.

The second ADC 213 performs processing similar to that performed in the case where the second ADC 213 is included in the receiving coil unit 20. The second ADC 213 receives the corrected analog fourth clock signal from the PLL 211, and the fifth signal generated by the PLL function 1213 of the sequence control circuitry 121. The second ADC 213 samples the analog fourth clock signal in accordance with the fifth clock signal, and generates a digital fourth clock signal.

The shift information generation circuitry 215 performs the processing similar to that performed in the case where the shift information generation circuitry 215 is included in the receiving coil unit 20. The shift information generation circuitry 215 receives the fifth clock signal and the digital fourth signal from the second ADC 213, and generates shift information based on the fifth clock signal and the digital fourth clock signal.

The fifth clock signal is generated by multiplying the first clock signal used for RF pulse generation, as described above. Accordingly, the fifth clock signal is synchronized with the first clock signal. Thus, the shift information regarding the shift between the first clock signal at the MRI apparatus 10 side and the second clock signal at the receiving coil unit 20 side can be generated as a result.

The shift correction circuitry 217 performs processing similar to that performed in the case where the shift correction circuitry 217 is included in the receiving coil unit 20. The shift correction circuitry 217 receives MR data from the MR signal receiver 119, and the shift information from the shift information generation circuitry 215. The shift correction circuitry 217 corrects the MR data based on the shift information.

According to the third embodiment, the configuration of the receiving coil unit can be simplified in addition to achieving highly accurate synchronization of clock, similarly to the aforementioned embodiments.

The functions of the processing circuitry 131 and receiving coil unit 20 explained in the embodiment can be executed based on a software program. The functions of the processing circuitry 131 and receiving coil unit 20 are stored in a magnetic disc (flexible disc, hard disc, etc.), an optical disc (CD-ROM, CD-R, CD-RW, DVD-ROM, DVD±R, DVD±RW, etc.), a semiconductor memory, or a similar storage medium, as a program executable by a computer. Provided that a storage medium is readable by a computer or a built-in system, any storage format can be adopted. In this case, the functions of the processing circuitry 131 and receiving coil unit 20 can be realized by a computer reading the program from the storage medium and executing instructions written in the program on the CPU. In addition, the storage medium is not limited to a medium independent from a computer or a built-in system; a storage medium storing or temporarily storing a program downloaded through LAN (local area network) or the Internet, etc. is also adoptable. Furthermore, the functions of the processing circuitry 131 and receiving coil unit 20 may be executed not only by means of one storage medium, but also of multiple storage media. In this case, any storage format is adaptable as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging system comprising a magnetic resonance imaging apparatus and a receiving coil unit,
the magnetic resonance imaging apparatus comprising:
control circuitry configured to generate a first clock signal; and
first transmitting circuitry configured to transmit an RF pulse based on the first clock signal,
the receiving coil unit comprising:
clock generating circuitry configured to generate a second clock signal;
at least one receiving coil configured to receive a magnetic resonance signal based on the RF pulse;
first conversion circuitry configured to sample the magnetic resonance signal in accordance with the second clock signal;
shift information generation circuitry configured to generate shift information by directly calculating a difference between the first clock signal and the second clock signal; and
shift correction circuitry configured to correct the sampled magnetic resonance signal by using the shift information.

2. The system according to claim 1, wherein the receiving coil unit further comprises receiving circuitry configured to receive, as a third clock signal, the first clock signal that has been wirelessly transmitted,
wherein the shift information generation circuitry compares the third clock signal with the second clock signal and to generate the shift information.

3. The system according to claim 2, wherein the receiving coil unit further comprises second conversion circuitry configured to sample the third clock signal in accordance with the second clock signal, and
wherein the shift information generation circuitry generates the shift information by using the sampled third clock signal.

4. The system according to claim 2, wherein the shift information generation circuitry calculates phase characteristics based on the number of cycles of the third clock signal, the phase characteristics including a plurality of points, and calculates a frequency shift between the first clock signal and the second clock signal based on a slope of a line connecting two selected points of the phase characteristics as the shift information.

5. The system according to claim 4, wherein the shift information generation circuitry updates the shift information based on a slope of an updated line obtained by changing at least one of the two selected points to a different point of the phase characteristics.

6. The system according to claim 2, wherein the receiving coil unit further comprises a phase locked loop (PLL) circuitry configured to correct fluctuation of the third clock signal.

7. The system according to claim 1, wherein a frequency of the second clock signal is higher than a frequency of the first clock signal.

8. The system according to claim 1, wherein a frequency of the second clock signal is an integer multiple of a frequency of the first clock signal.

9. The system according to claim 1, wherein the magnetic resonance imaging apparatus further comprises second transmitting circuitry configured to transmit the first clock signal by using at least one of amplitude modulation or frequency modulation.

10. The system according to claim 1, wherein the shift correction circuitry multiplies the sampled magnetic resonance signal by a complex in accordance with a frequency shift or a phase shift based on the shift information.

11. The system according to claim 1, wherein the receiving coil unit further comprises a plurality of receiving coils, wherein the first conversion circuitry samples each magnetic resonance signal received by the plurality of receiving coils in accordance with the second clock signal, and
wherein the shift correction circuitry corrects each sampled magnetic resonance signal by using the shift information.

12. A receiving coil unit comprising:
receiving circuitry configured to receive, as a third clock signal, a first clock signal that has been wirelessly transmitted,
at least one receiving coil configured to receive a magnetic resonance signal based on an RF pulse;
clock generating circuitry configured to generate a second clock signal with a frequency higher than a frequency of the first clock signal;
conversion circuitry configured to sample the magnetic resonance signal in accordance with the second clock signal;
shift information generating circuitry configured to generate shift information by directly calculating a difference between the first clock signal and the second clock signal by comparing the third clock signal with the second clock signal;
shift correction circuitry configured to correct the sampled magnetic resonance signal by using the shift information; and
transmitting circuitry configured to wirelessly transmit the corrected magnetic resonance signal.

13. A magnetic resonance imaging system comprising a magnetic resonance imaging apparatus and a receiving coil unit, the magnetic resonance imaging apparatus comprising:
control circuitry configured to generate a first clock signal; and
first transmitting circuitry configured to transmit an RF pulse based on the first clock signal,
the receiving coil unit comprising:
clock generating circuitry configured to generate a second clock signal;
at least one receiving coil configured to receive a magnetic resonance signal based on the RF pulse; and
first conversion circuitry configured to sample the magnetic resonance signal in accordance with the second clock signal,
wherein the magnetic resonance imaging apparatus further comprises:
shift information generation circuitry configured to generate shift information by directly calculating a difference between the first clock signal and the second clock signal; and
shift correction circuitry configured to correct the sampled magnetic resonance signal by using the shift information.

14. The system according to claim 13, wherein the magnetic resonance imaging apparatus further comprises receiving circuitry configured to receive, as a fourth clock signal, the second clock signal that has been wirelessly transmitted,
wherein the shift information generation circuitry compares the fourth clock signal with the fifth clock signal which is generated by multiplying the first clock signal and to generate the shift information.

15. The system according to claim 14, wherein the magnetic resonance imaging apparatus further comprises second conversion circuitry configured to sample the fourth clock signal in accordance with the fifth clock signal, and
wherein the shift information generation circuitry generates the shift information by using the sampled fourth clock signal.

16. The system according to claim 14, wherein the shift information generation circuitry calculates phase characteristics based on the number of cycles of the fourth clock signal, the phase characteristics including a plurality of points, and calculates a frequency shift between the first clock signal and the second clock signal based on a slope of a line connecting two selected points of the phase characteristics as the shift information.

17. The system according to claim 16, wherein the shift information generation circuitry updates the shift information based on a slope of an updated line obtained by changing at least one of the two selected points to a different point of the phase characteristics.

18. The system according to claim 14, wherein the receiving coil unit further comprises a phase locked loop (PLL) circuitry configured to correct fluctuation of the fourth clock signal.

19. The system according to claim 13, wherein a frequency of the fifth clock signal is higher than a frequency of the second clock signal.

20. The system according to claim 13, wherein a frequency of the fifth clock signal is an integer multiple of a frequency of the second clock signal.

* * * * *